(12) United States Patent
Tong et al.

(10) Patent No.: US 10,720,555 B2
(45) Date of Patent: Jul. 21, 2020

(54) LIGHT EMITTING DIODE DEVICE AND MANUFACTURING METHOD THEREOF

(71) Applicant: Lextar Electronics Corporation, Hsinchu (TW)

(72) Inventors: Hung-Chun Tong, New Taipei (TW); Chang-Zhi Zhong, Hsinchu County (TW); Fu-Hsin Chen, Hsinchu County (TW); Yu-Chun Lee, Hsinchu County (TW)

(73) Assignee: LEXTAR ELECTRONICS CORPORATION, Hsinchu (TW)

(*) Notice: Subject to any disclaimer, the term of this patent is extended or adjusted under 35 U.S.C. 154(b) by 0 days.

(21) Appl. No.: 16/203,568

(22) Filed: Nov. 28, 2018

(65) Prior Publication Data

US 2020/0127171 A1    Apr. 23, 2020

(30) Foreign Application Priority Data

Oct. 22, 2018    (TW) ............................. 107137241 A

(51) Int. Cl.
| | |
|---|---|
| *H01L 33/50* | (2010.01) |
| *H01L 33/54* | (2010.01) |
| *H01L 33/60* | (2010.01) |
| *H01L 33/62* | (2010.01) |
| *H01L 33/20* | (2010.01) |
| *H01L 33/00* | (2010.01) |
| *H01L 33/64* | (2010.01) |

(52) U.S. Cl.
CPC .......... *H01L 33/502* (2013.01); *H01L 33/005* (2013.01); *H01L 33/20* (2013.01); *H01L 33/60* (2013.01); *H01L 33/644* (2013.01); *H01L 2933/0025* (2013.01); *H01L 2933/0041* (2013.01); *H01L 2933/0058* (2013.01)

(58) Field of Classification Search
CPC ........ H01L 33/50; H01L 33/502; H01L 33/60
See application file for complete search history.

(56) References Cited

U.S. PATENT DOCUMENTS

| | | |
|---|---|---|
| 2011/0309388 A1 | 12/2011 | Ito et al. |
| 2012/0140506 A1 | 6/2012 | Waragawa et al. |
| 2014/0226308 A1 | 8/2014 | Fukuda et al. |
| 2017/0033267 A1 | 2/2017 | Tamaki et al. |
| 2018/0151785 A1* | 5/2018 | Hashimoto ............. H01L 33/60 |
| 2019/0035986 A1* | 1/2019 | Maeda .................. H01L 33/505 |

* cited by examiner

*Primary Examiner* — David C Spalla
(74) *Attorney, Agent, or Firm* — CKC & Partners Co., LLC

(57) ABSTRACT

A light emitting diode device includes a light emitting diode chip, a wavelength conversion layer including a bottom surface facing a top surface of the light emitting diode chip, and an interlayer having a first portion between the light emitting diode chip and a part of the bottom surface of the wavelength conversion layer, and a second portion extending from the first portion and connected between a remaining part of the bottom surface of the wavelength conversion layer and a side surface of the light emitting diode chip. The second portion has a side surface including a linear surface substantially aligning with a side surface of the wavelength conversion layer, and a curved surface having a first end connected to the linear surface and a second end connected to the side surface of the light emitting diode chip. The linear surface and the curved surface define a chamfer angle.

9 Claims, 12 Drawing Sheets

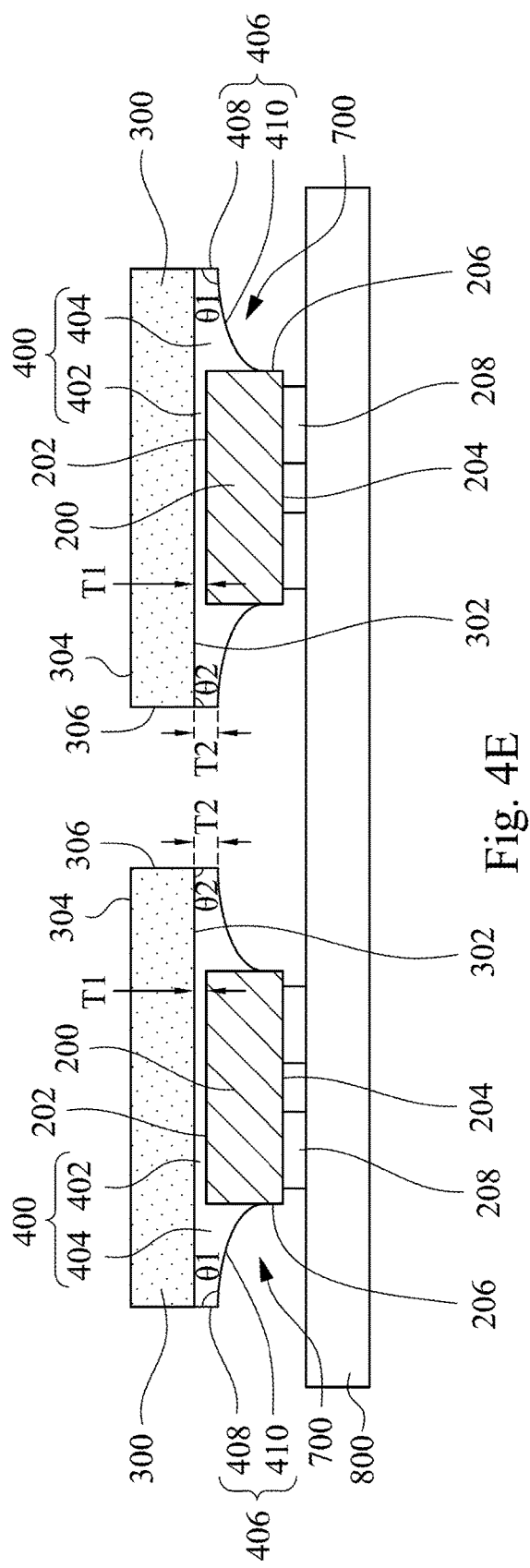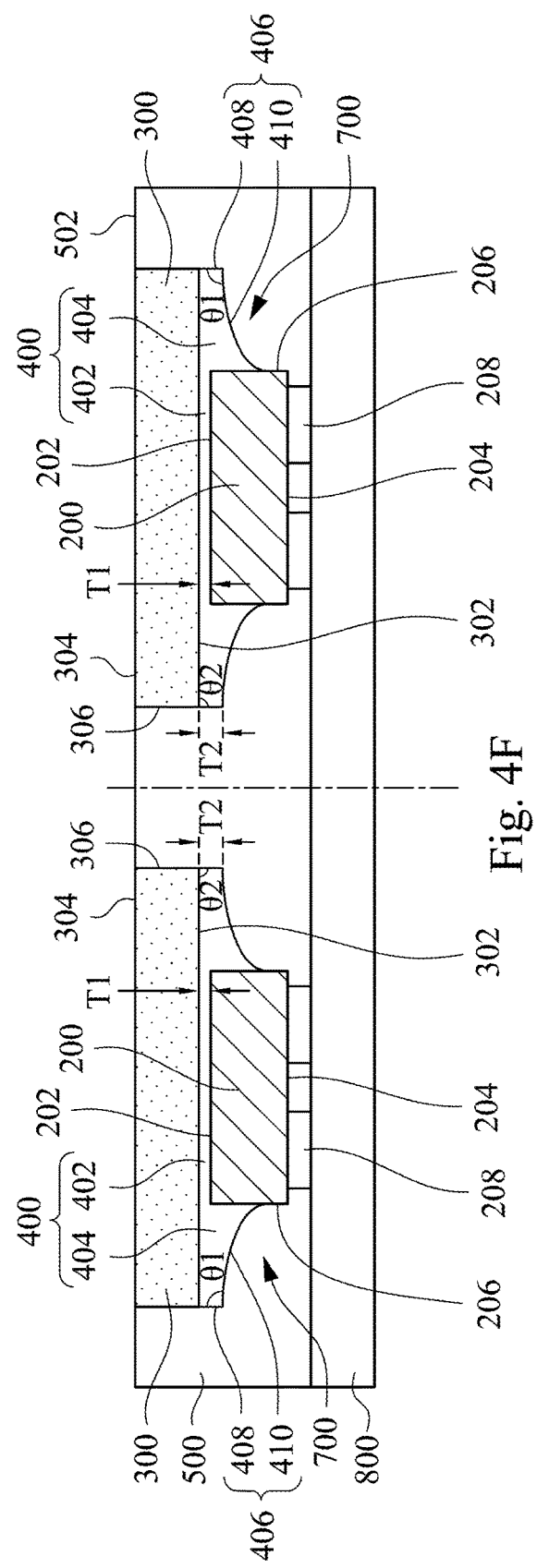
Fig. 4E
Fig. 4F

LIGHT EMITTING DIODE DEVICE AND MANUFACTURING METHOD THEREOF

CROSS-REFERENCE TO RELATED APPLICATION

This application claims priority to Taiwan Application Serial Number 107137241, filed Oct. 22, 2018, which is herein incorporated by reference in its entirety.

BACKGROUND

Field of Invention

The present invention relates to a light emitting diode device and a manufacturing method thereof.

Description of Related Art

A light emitting diode (LED) has long life, small size, low vibration, low power consumption, or the like, such that it has been widely applied in indicator light or home-used light source. Nowadays, with the development of the multi colors and high brightness, LEDs have been applied in various display devices, illuminating devices, or the like.

The light emitting diode chip of the traditional light emitting diode device has a heat dissipation problem. Furthermore, the light emitted by the light emitting diode chip may be output without passing through a wavelength conversion element, which leads to the non-uniformity of the illumination.

SUMMARY

The embodiments of the present disclosure provide a light emitting diode device. An interlayer with a reduced thickness between a wavelength conversion layer and a light emitting diode chip enhances the heat dissipation of the light emitting diode chip, which improves the light stability of the light emitting diode device. A portion of an interface between the interlayer and the reflective element is smooth, and a side surface of the wavelength conversion layer is in direct contact with the reflective element such that the light emitted by the light emitting diode chip may not output without passing through the wavelength conversion layer. Therefore, the present light emitting diode device can have enhanced light extraction efficiency of the side emitting light and can satisfy the requirement of outputting uniform light.

In some embodiments, a light emitting diode device includes a light emitting diode chip, a wavelength conversion layer, and an interlayer. The wavelength conversion layer includes a bottom surface facing a top surface of the light emitting diode chip. The interlayer has a first portion and a second portion. The first portion of the interlayer is between the light emitting diode chip and a part of the bottom surface of the wavelength conversion layer. The second portion of the interlayer extends from the first portion of the interlayer and is connected between a remaining part of the bottom surface of the wavelength conversion layer and a side surface of the light emitting diode chip. The second portion of the interlayer has a side surface including a linear surface and a curved surface. The linear surface substantially aligns with a side surface of the wavelength conversion layer. The curved surface has a first end connected to the linear surface and a second end connected to the side surface of the light emitting diode chip. The linear surface and the curved surface define a chamfer angle.

In some embodiments, the chamfer angle is in a range from about 90° to about 160°.

In some embodiments, an angle between the linear surface and the bottom surface of the wavelength conversion layer is below about 90°.

In some embodiments, the interlayer is an adhesive.

In some embodiments, the wavelength conversion layer includes quantum dots, phosphor particles, or combinations thereof.

In some embodiments, the light emitting diode device further includes a reflective element encapsulating the side surface of the wavelength conversion layer, the side surface of the second portion of the interlayer, and the side surface of the light emitting diode chip uncovered by the second portion of the interlayer. The side surface of the wavelength conversion layer is in direct contact with the reflective element.

In some embodiments, a thickness of the first portion of the interlayer is less than a minimum thickness of the second portion of the interlayer.

In some embodiments, the light emitting diode device further includes a substrate. The light emitting diode chip is flip chip mounted to the substrate.

In some embodiments, a method of manufacturing a light emitting diode device includes providing a wavelength conversion layer; forming an adhesive interlayer on the wavelength conversion layer; disposing a plurality of light emitting diode chips on the interlayer at intervals; heating and pressing the interlayer such that a portion of the interlayer flows to the intervals between the light emitting diode chips and the side surfaces of the light emitting diode chips, wherein a surface the interlayer on the intervals between the light emitting diode chips forms a curved surface; making a first cut through the interlayer on the intervals between the light emitting diode chips and the underlying wavelength conversion layer to form a plurality of light emitting units, in which the first cut allows the interlayer to have at least one side surface, the side surface and the curved surface after making the first cut form a chamfer angle; and forming a reflective element to wrap a side surface of each of the light emitting units.

In some embodiments, the method further includes performing a solidification process. The solidification process is performed after the heating and the pressing such that the adhesive interlayer is solidified on the side surface of the light emitting diode chips.

In some embodiments, the chamfer angle is in a range from about 90° to about 160°.

In some embodiments, after making the first cut, a substrate is provided such that the light emitting units are disposed on the substrate, and the reflective element is formed on the substrate to wrap the side surfaces of each of the light emitting units.

In some embodiments, the method further includes making a second cut through the reflective element between the light emitting units to form the light emitting units wrapped by the reflective element.

In some embodiments, the substrate is removed after making the second cut.

In some embodiments, after providing the substrate, the light emitting units are upside down to allow the light emitting diode chips to be in contact with the substrate.

In some embodiments, the method further includes making a second cut through the reflective element and the substrate between the light emitting units to form the light emitting units wrapped by the reflective element on the substrate.

In some embodiments, the substrate is a wiring substrate, and the light emitting diode chip is flip chip mounted to the wiring substrate.

In some embodiments, the heating and the pressing make the tan δ of the interlayer be in a range from about 0.7 to about 3.0.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIGS. 4A-4G are cross-sectional views of a light emitting diode device at various stages of a method in accordance with another embodiment.

DETAILED DESCRIPTION

Figure 1A:
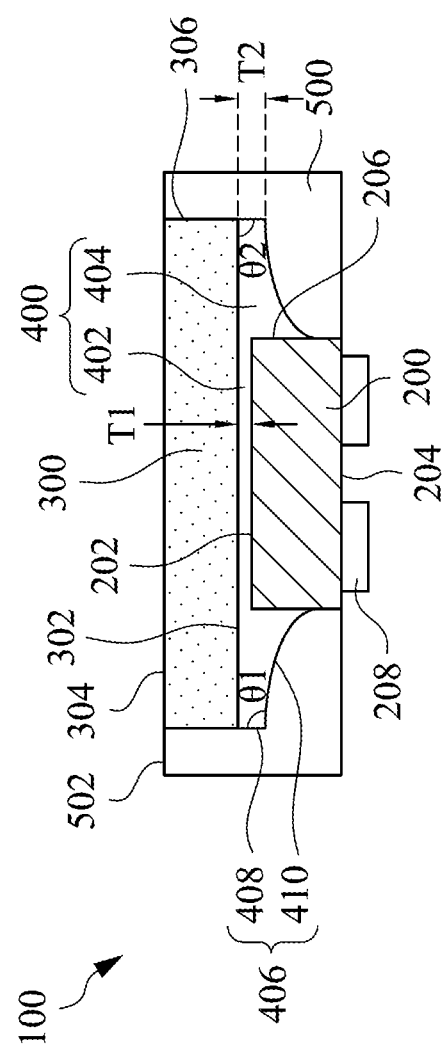
FIG. 1A is a cross-sectional view of a light emitting diode device in accordance with some embodiments.

Reference will now be made in detail to the present embodiments of the invention, examples of which are illustrated in the accompanying drawings. Wherever possible, the same reference numbers are used in the drawings and the description to refer to the same or like parts.

FIG. 1A is a cross-sectional view of a light emitting diode device 100 in accordance with some embodiments of the present disclosure. The light emitting diode device 100 includes a light emitting diode chip 200, a wavelength conversion layer 300, an interlayer 400, and a reflective element 500. The light emitting diode chip 200 includes a top surface 202, a bottom surface 204 opposed to the top surface 202, and a side surface 206 between the top surface 202 and the bottom surface 204. The light emitting diode device 100 further includes two electrodes 208, for example, a positive electrode and a negative electrode, disposed on the bottom surface 204. The wavelength conversion layer 300 includes a bottom surface 302 facing the top surface 202 of the light emitting diode chip 200, a side surface 306 connected to the bottom surface 302, and a light emitting surface 304 opposed to the bottom surface 302.

In some embodiments, the light emitting diode chip 200 includes an n-type semiconductor layer, a p-type semiconductor layer, and an active layer between the n-type semiconductor layer and the p-type semiconductor layer. In some embodiments, the light emitting diode chip 200 emits blue light. In some embodiments, the light emitting diode chip 200 is flip chip type.

In some embodiments, the wavelength conversion layer 300 is an encapsulant material including a wavelength conversion material, for example, phosphor particles, pigments, paints, quantum dots, the like, or combinations thereof, and is configured to convert a wavelength of a portion of the light emitted by the light emitting diode chip 200.

In some embodiments, the interlayer 400 is an adhesive and is configured to fix the light emitting diode chip 200 on the wavelength conversion layer 300. In some embodiments, the interlayer 400 is a light permeable adhesive layer and made of, but is not limited to, light permeable polymer colloid, such as silicone resin, epoxy resin, the like, or combinations thereof, and can be added with a filler, for example, $TiO_2$, $SiO_2$, $Al_2O_3$, BN, ZnO, the like, or combinations thereof, to adjust a path of a light or enhance a heat transfer coefficient. The interlayer 400 has a first portion 402 between the top surface 202 of the light emitting diode chip 200 and a part of the bottom surface 302 of the wavelength conversion layer 300. The interlayer 400 further includes a second portion 404 extending from the first portion 402 and connected to a remaining part of the bottom surface 302 of the wavelength conversion layer 300 and the side surface 206 of the light emitting diode chip 200.

The side surface 406 of the second portion 404 of the interlayer 400 includes a linear surface 408 and a curved surface 410. The linear surface 408 substantially aligns with the side surface 306 of the wavelength conversion layer 300. In other words, the linear surface 408 is coplanar with the side surface 306 of the wavelength conversion layer 300. The curved surface 410 has a first end connected to the linear surface 408, and a second end connected to the side surface 206 of the light emitting diode chip 200. The linear surface 408 and the curved surface 410 form a chamfer angle θ1. In some embodiments, the chamfer angle θ1 is in a range from about 90° to about 160°. The linear surface 408 and the bottom surface 302 of the wavelength conversion layer 300 form an angle θ2≤90°. In some embodiments, the chamfer angle θ1≥the angle θ2. Therefore, the second portion 404 of the interlayer 400 has a volume formed by the linear surface 408, the curved surface 410, the side surface 206 of the light emitting diode chip 200, and a portion of the bottom surface 302 of the wavelength conversion layer 300.

In some embodiments where the light emitting diode chip 200 is flip chip mounted to a wiring board (not shown), since an active layer of the light emitting diode chip 200 is near the bottom surface 204 of the light emitting diode chip 200, by disposing the second portion 404 of the interlayer 400 on the side surface 206 of the light emitting diode chip 200, light extraction of the side surface 206 of the light emitting diode chip 200 is enhanced, which results in an enhancement of brightness of the light emitting diode device 100. Furthermore, the second portion 404 of the interlayer 400 with the increased volume can reduce a possibility of the blue light reflected directly back into the light emitting diode chip 200 itself from the reflective element 500, which reduces re-absorption of the blue light by the light emitting diode chip 200, which alleviates the loss of the efficiency of the blue light By the configuration of the linear surface 408, the curved surface 410, a thickness T2 and the chamfer angle θ1, the volume of the second portion 404 of the interlayer 400 is increased.

Figure 1B:
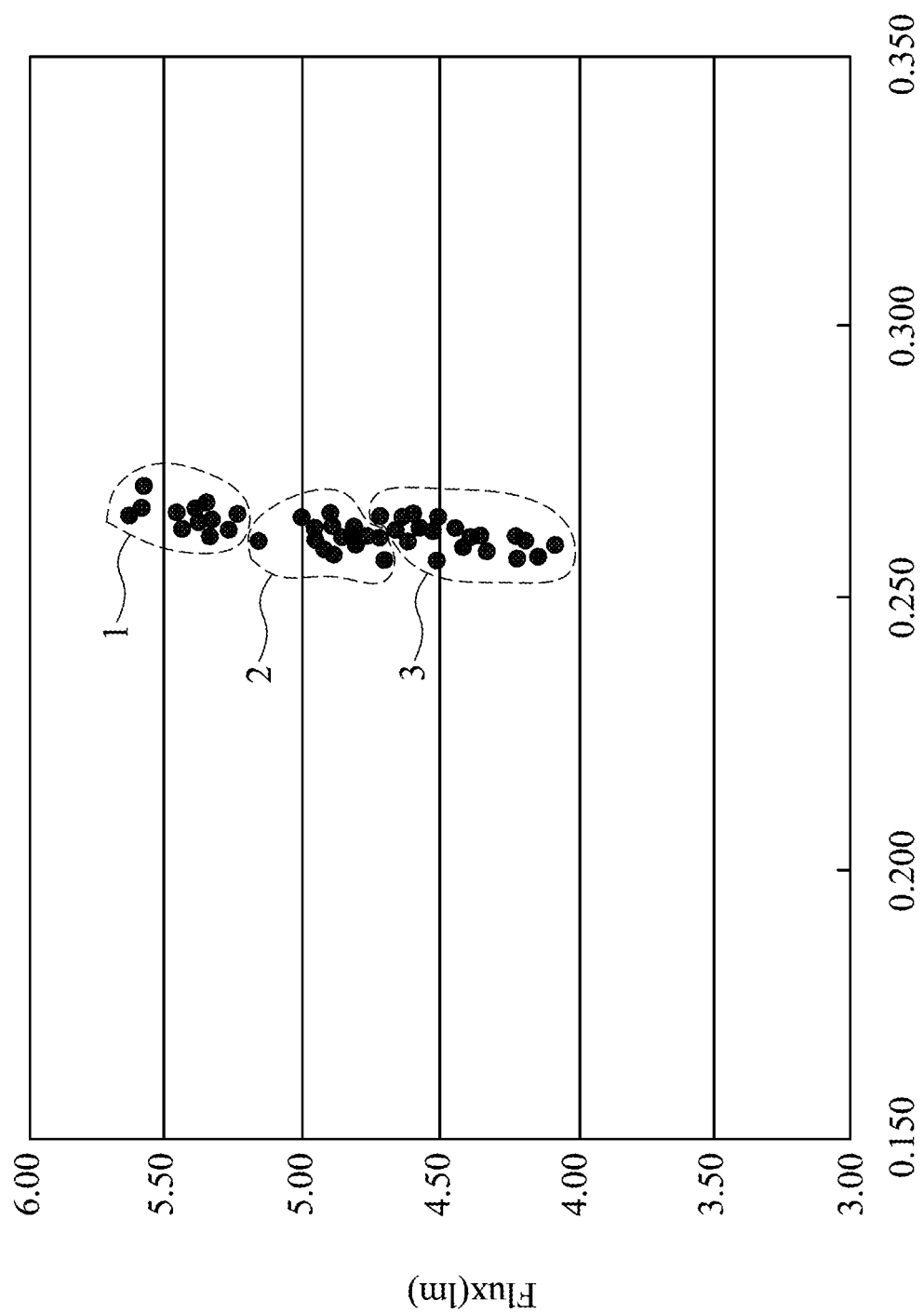
FIG. 1B is a graph comparing the luminous flux of a light emitting diode device of the present embodiment and the luminous flux of light emitting diode devices of prior arts.

FIG. 1B is a graph comparing the luminous flux of the light emitting diode device of the present embodiment and the light emitting diode devices of prior arts. As shown in FIG. 1B, the data surrounded by a dotted line 1 is brightness data of the present embodiment. The data surrounded by a dotted line 2 and dotted line 3 are brightness data of a first prior art and a second prior art, respectively. A side surface 406 of the interlayer 400 of the light emitting diode device of the first prior art is a continuous smooth surface but not a linear surface. That is to say, the side surface 406 of the interlayer 400 of the first prior art does not have a chamfer angle which is like the chamfer angle formed by the linear surface 408 and the curved surface 410 of the present embodiment. The interlayer 400 of the light emitting diode device of the second prior art does not have a second portion 404. That is to say, the side surface of the light emitting diode device of the second prior art is in direct contact with an inner surface of the reflective element 500. According to FIG. 1B, the light emitting diode device of the present embodiment has the brightness higher than the brightness of the light emitting diode devices the first prior art and the second prior art. In particular, the brightness of the light emitting diode device of the present embodiment is about 8% higher than the light emitting diode device of the first prior art. The brightness of the light emitting diode device of the present embodiment is about 12% higher than the brightness of the light emitting diode device of the second prior art.

The first portion 402 of the interlayer 400 has a thickness T1 less than the minimum thickness T2 of the second portion 404 of the interlayer 400. In some embodiments, the thickness T1 of the first portion 402 of the interlayer 400 is less than about 20 μm. The thickness T1 is thin enough such that a path of heat dissipation of the light emitting diode chip 200 becomes short. That is to say, the heat generated by the light emitting diode chip 200 can be quickly transferred to the wavelength conversion layer 300 through the first portion 402 of the interlayer 400 and in turn transferred to outer space. Therefore, an operating temperature of the light emitting diode chip 200 can be reduced such that the efficiency of the heat dissipation is enhanced. For example, in some embodiments where the thickness T1 is about 20 μm, a surface temperature of the light emitting diode chip 200 is from about 180° C. to about 190° C. In some embodiments where the thickness T1 is about 13 μm, a surface temperature of the light emitting diode chip 200 is from about 145° C. to about 155° C. In some embodiments where the thickness is about 3 μm, a surface temperature of the light emitting diode chip 200 is from about 95° C. to about 105° C. In other words, when the thickness T1 is reduced from about 20 μm to about 13 μm, the difference of surface temperature therebetween can be from about 30° C. to about 40° C. When the thickness T1 is reduced from about 13 μm to about 3 μm, the surface temperature difference therebetween can be from about 45° C. to about 55° C.

The reflective element 500 encapsulates the side surface 306 of the wavelength conversion layer 300, the side surface 406 of the second portion 404 of the interlayer 400 (e.g., the linear surface 408 and the curved surface 410), and a portion of the side surface 206 of the light emitting diode chip 200 not covered by the second portion 404 of the interlayer 400, and exposes the light emitting surface 304 of the wavelength conversion layer 300 and the two electrodes 208 to maintain a top emitting light emitted by the light emitting diode device 100 and enhance a light extraction efficiency of the light emitting diode device 100. In some embodiments, the reflective element 500 is a material having a high reflectance which is able to reflect light, for example, a white reflective material including $TiO_2$ and silicone resin. In some embodiments, the linear surface 408 of the second portion 404 of the interlayer 400 is a substantial smooth surface such that when the light arrives at an interface between the linear surface 408 and the reflective element 500, a multi-reflective phenomenon of the light is decreased and results in the enhanced light extraction efficiency of the side emitting light of the light emitting diode device 100.

Furthermore, if a material exists between the side surface 306 of the wavelength conversion layer 300 and the reflective element 500, the light emitted by the light emitting diode chip 200 may output to outer space without being converted by the wavelength conversion layer 300. For example, if a portion of the interlayer 400 (or other light guide medium) is positioned between the side surface 306 of the wavelength conversion layer 300 and the reflective element 500, the light emitted by the light emitting diode chip 200 may output to outer space through the interlayer 400 on the side surface of the light emitting diode chip 200 without being converted by the wavelength conversion layer 300, or may output to outer space from the top surface 502 of the reflective element 500 through the interlayer 400 (or other light guide medium). Therefore, in some embodiments, the side surface 306 of the wavelength conversion layer 300 is in direct contact with the reflective element 500 such that the light emitted by the light emitting diode chip 200 can pass through the first portion 402 or the second portion 404 of the interlayer 400 and then is incident to the wavelength conversion layer 300 through the bottom surface 302 of the wavelength conversion layer 300 and then output through the light emitting surface 304, which prevents the light emitted by the light emitting diode chip 200 from outputting without being converted by the wavelength conversion layer 300. That is to say, the light emitted by the light emitting diode chip 200 will not output from the top surface 502 of the reflective element 500 after passing through the first portion 402 or the second portion 404 of the interlayer 400. Therefore, the light of the light emitting diode device 100 has an enhanced uniformity. For example, the light emitted by the light emitting diode chip 200 is blue light, and the wavelength conversion layer 300 includes red quantum dots and green quantum dots. The blue light can pass through the first portion 402 or the second portion 404 of the interlayer 400 and then be transmitted to the wavelength conversion layer 300 by completely passing through the bottom surface 302 of the wavelength conversion layer 300. The red quantum dots absorb a portion of the blue light and in turn emit a red light. The green quantum dots absorb a portion of the blue light and in turn emit a green light. Therefore, after the red light, the green light, and the remaining blue light mix, a white light is produced.

Figure 2:
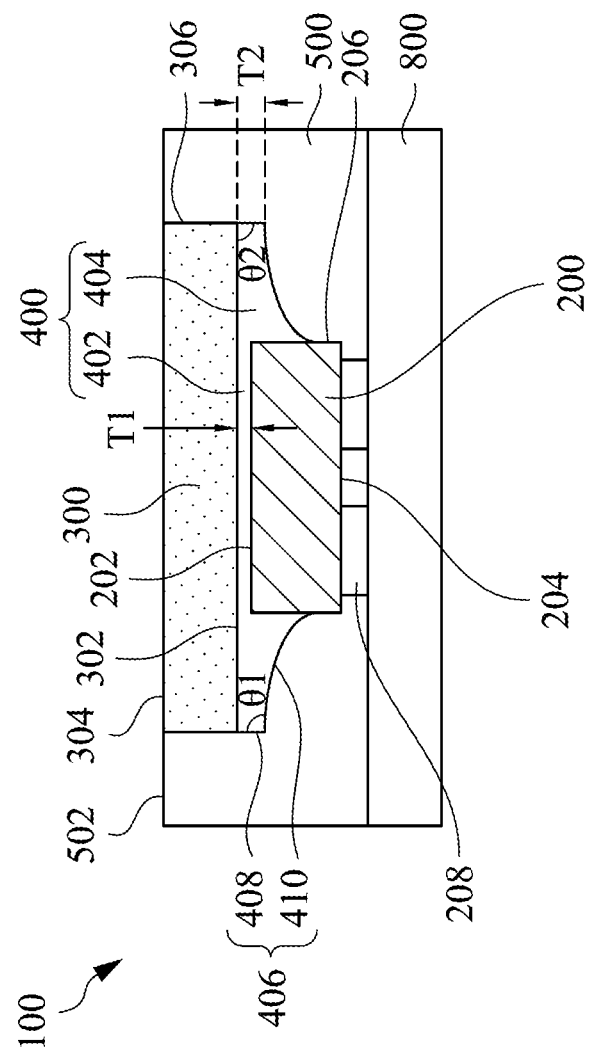
FIG. 2 is a cross-sectional view of a light emitting diode device in accordance with another embodiment.

FIG. 2 is a cross-sectional view of a light emitting diode device in accordance with another embodiment. As shown in FIG. 2, the main difference between the present embodiment and the embodiment shown in FIG. 1A is that: the present embodiment further includes a substrate 800. A plurality of bonding pads (not shown) are disposed on the substrate 800 corresponding to the two electrodes 208 of the light emitting diode chip 200. In the present embodiment, the light emitting diode chip 200 is flip chip mounted to the substrate 800. Therefore, a heat resistance of the encapsulation is reduced such that a light emitting efficiency of the light emitting diode device 100 is improved. In the present embodiment, the substrate 800 is a wiring substrate. In some embodiments, the substrate 800 is a wiring ceramic heat dissipation substrate or a metal core printed circuit board (MCPCB). Furthermore, since the light emitting diode chip 200 is flip chip mounted to the substrate 800, an active layer of the light emitting diode chip 200 is near the bottom surface 204 of the light emitting diode chip 200. Since the second portion 404 of the interlayer 400 is on the side surface 206 of the light emitting diode chip 200, a light extraction of the side surface 206 of the light emitting diode chip 200 is increased such that a brightness of the light emitting diode device 100 is increased.

Figure 3A:
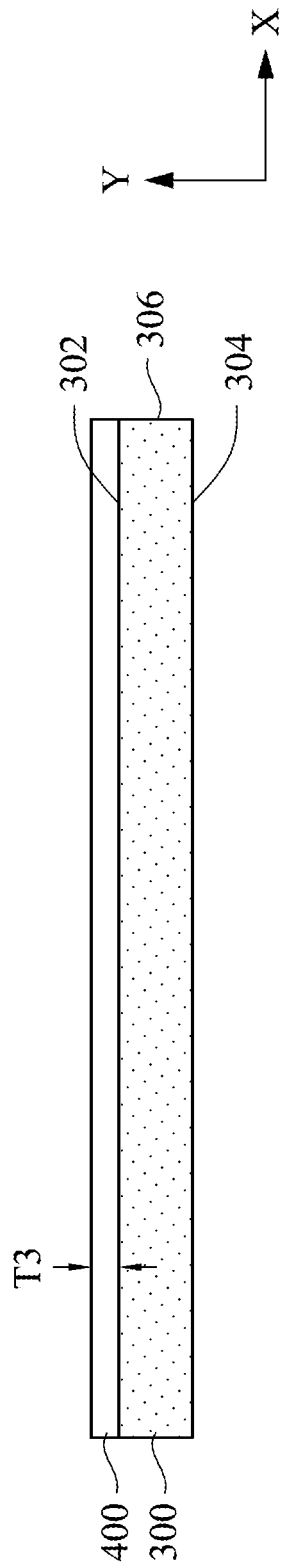
FIGS. 3A-3H are cross-sectional views of a light emitting diode device at various stages of a method in accordance with some embodiments.

FIGS. 3A-3H are cross-sectional views of a light emitting diode device at various stages of a method in accordance with some embodiments. Reference is made to FIG. 3A. A method of manufacturing a light emitting diode device includes providing a wavelength conversion layer 300. The wavelength conversion layer 300 includes a first surface 302 (referred to as the bottom surface 302 in FIG. 1A), an opposing second surface 304 (referred to as the light emitting surface 304 in FIG. 1A), and a side surface 306 connected to the first surface 302 and the second surface 304. An interlayer 400 is formed on the first surface 302 of the wavelength conversion layer 300. The interlayer 400 is an adhesive layer. For example, the interlayer 400 is an adhesive and has a thickness T3.

Figure 3B:
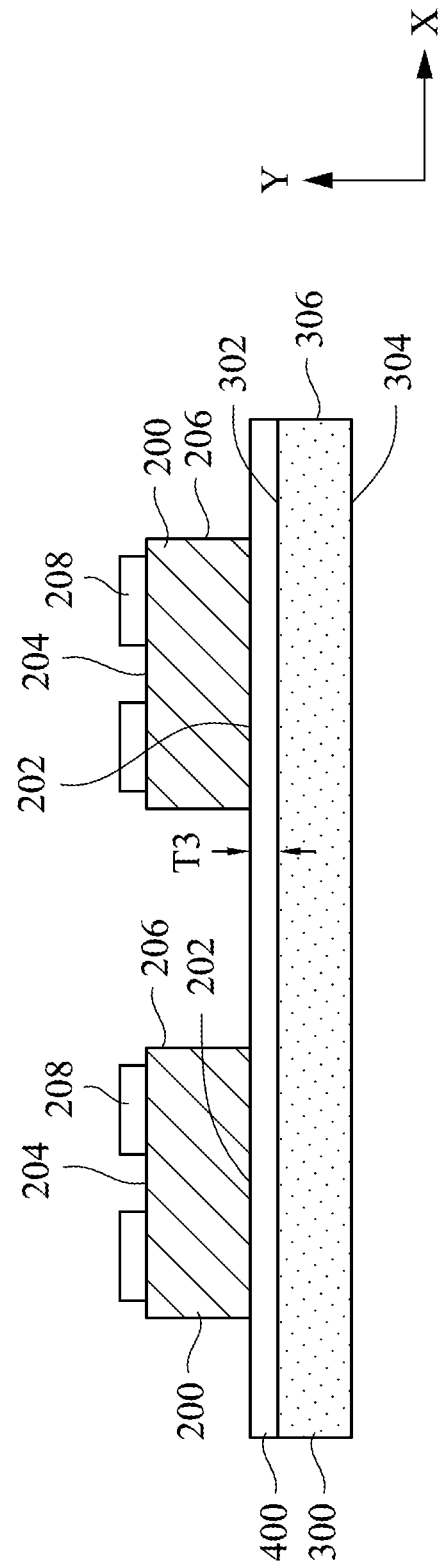

Reference is made to FIG. 3B. A plurality of light emitting diode chips 200 are disposed on the interlayer 400 along a first direction X and a second direction Y perpendicular to the first direction X at intervals. A surface 202 (referred to as the top surface 202 in FIG. 1A) of the light emitting diode chip 200 is in contact with the interlayer 400. The light emitting diode chip 200 has two electrodes 208 disposed on another surface 204 (referred to as the bottom surface 204 in FIG. 1A) of the light emitting diode chip 200. It is to be understood that the number of the light emitting diode chips 200 is not limited to two and can be three, four, or more.

Figure 3C:
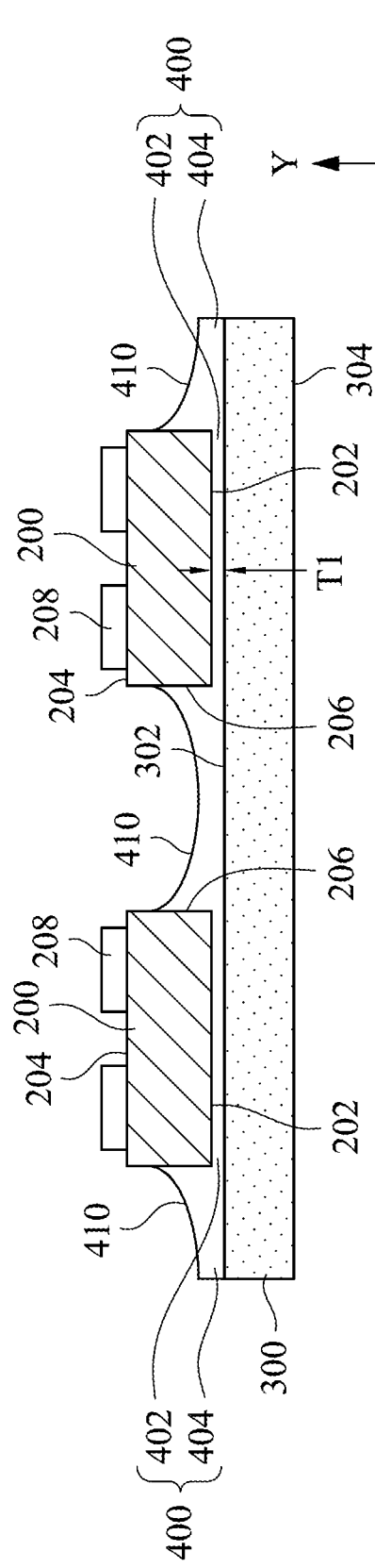

As shown in FIG. 3C, the interlayer 400 is heated and pressed such that a fluidity of the interlayer 400 after being heated and pressed is greater than a fluidity of the interlayer 400 before being heated and pressed, such that a portion of the interlayer 400 flows to the intervals between the light emitting diode chips 200 and flows to the side surface 206 of the light emitting diode chip 200. Therefore, the interlayer 400 surrounds the light emitting diode chip 200. A portion of interlayer 400 exists between the light emitting diode chip 200 and the wavelength conversion layer 300. The thickness T3 of the portion of the interlayer 400 between the wavelength conversion layer 300 and the light emitting diode chip 200 becomes a thickness T1 which is less than the thickness T3. That is to say, the first portion 402 of the interlayer 400 between the wavelength conversion layer 300 and the light emitting diode chip 200 has a thickness T1. In particular, by adjusting a rheological property of the interlayer 400, for example, by controlling the tan δ (in which tan δ=G"/G', G' is a storage elastic modulus of the interlayer 400, and G" is a loss elastic modulus of the interlayer 400) of the interlayer 400 to be in a range from about 0.7 to about 3.0 and using a thermocompression bond tool to perform a heating process and a pressing process, the thickness T1 of the first portion 402 of the interlayer 400 can be less than about 20 μm. Meanwhile, the thickness T2 of the second portion 404 of the interlayer 400 maintains greater than the thickness T1 of the first portion 402 of the interlayer 400, which is beneficial for the light extraction of the side emitting light of the light emitting diode chip 200 and further enhances a brightness of the light emitting diode device 100. The second portion 404 of the interlayer 400 with the increased volume can reduce a possibility of the blue light reflected directly back into the light emitting diode chip 200 itself from the reflective element 500, which reduces re-absorption of the blue light by the light emitting diode chip 200, which alleviates the loss of the efficiency of the blue light. The thickness T1 of the first portion 402 of the interlayer 400 is thin enough such that a path of heat dissipation of the light emitting diode chip 200 is shortened. That is to say, the heat produced by the light emitting diode chip 200 can be transferred to the wavelength conversion layer 300 through the first portion 402 of the interlayer 400 and then be transferred to outer space, which can effectively alleviate the operation temperature of the light emitting diode chip 200, which results in enhanced heat dissipation. Moreover, the surface of the interlayer 400 on the intervals between the light emitting diode chips 200 forms a curved surface 410.

Afterward, a solidification process is performed after the pressing and the heating such that the interlayer 400 is solidified and fixed on the side surface 206 of the light emitting diode chip 200 and the top surface 202 facing the wavelength conversion layer 300.

Figure 3D:
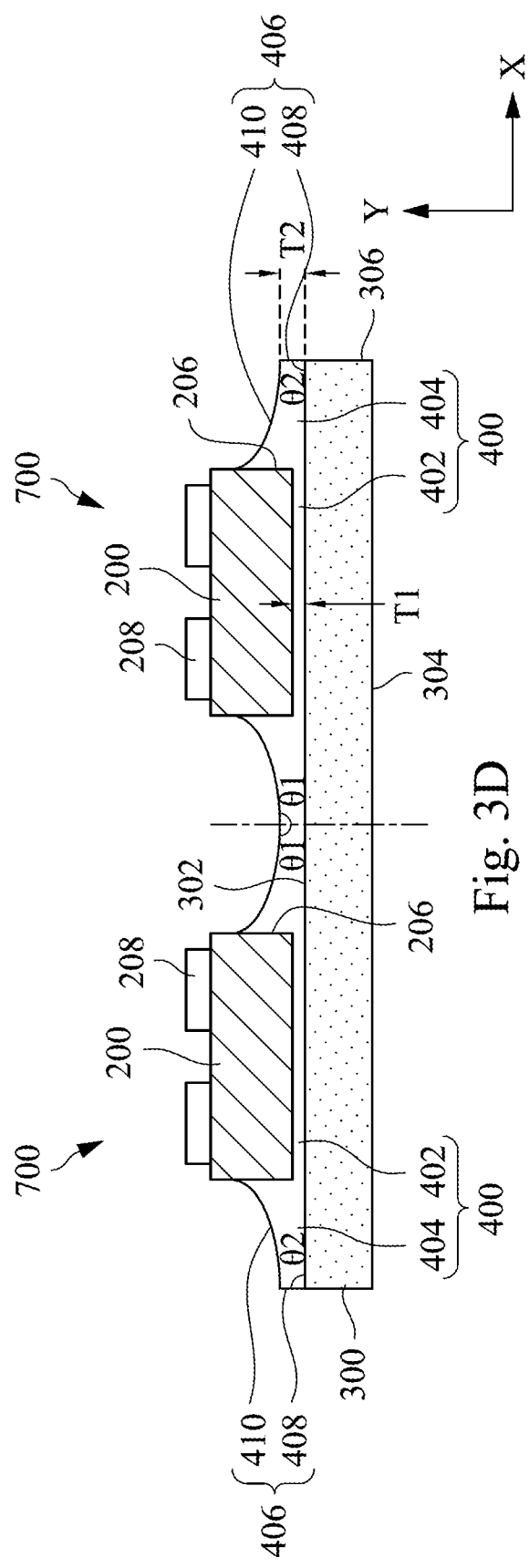

Reference is made to FIG. 3D. A first cut is made through the interlayer 400 on the intervals between the light emitting diode chips 200 and the underlying wavelength conversion layer 300 to form a plurality of light emitting units 700. The interlayer 400 of each of the light emitting units 700 has a second portion 404 connected to the first portion 402. The second portion 404 of the interlayer 400 has a minimum thickness T2. The thickness T1 of the first portion 402 of the interlayer 400 is less than the thickness T2 of the second portion 404 of the interlayer 400. The first cut allows the second portion 404 of the interlayer 400 to have at least one side surface 406. The side surface 406 has a linear surface 408 and the cut curved surface 410. The linear surface 408 substantially aligns with the side surface 306 of the wavelength conversion layer 300. That is to say, the linear surface 408 of the second portion 404 of the interlayer 400 is coplanar with the side surface 306 of the wavelength conversion layer 300. The linear surface 408 and the cut curved surface 410 form a chamfer angle θ1 (see FIGS. 3D and 3F). In some embodiments, the chamfer angle θ1 is in a range from about 90° to about 160°.

Figure 3E:
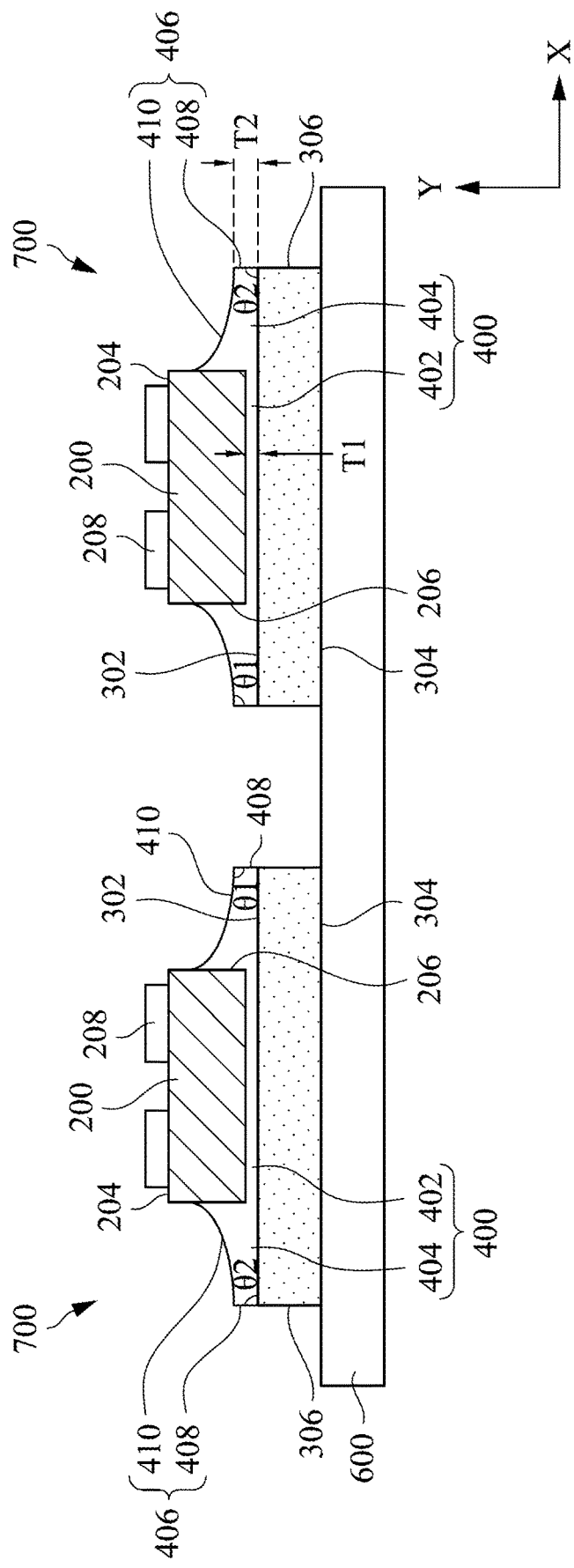

Reference is made to FIG. 3E. A substrate 600 for a support purpose is provided such that the light emitting units 700 can be disposed on the substrate 600. In the present embodiment, the substrate 600 is a support substrate such as a glass substrate, a metal substrate, a tape, or other suitable support structures.

Figure 3F:
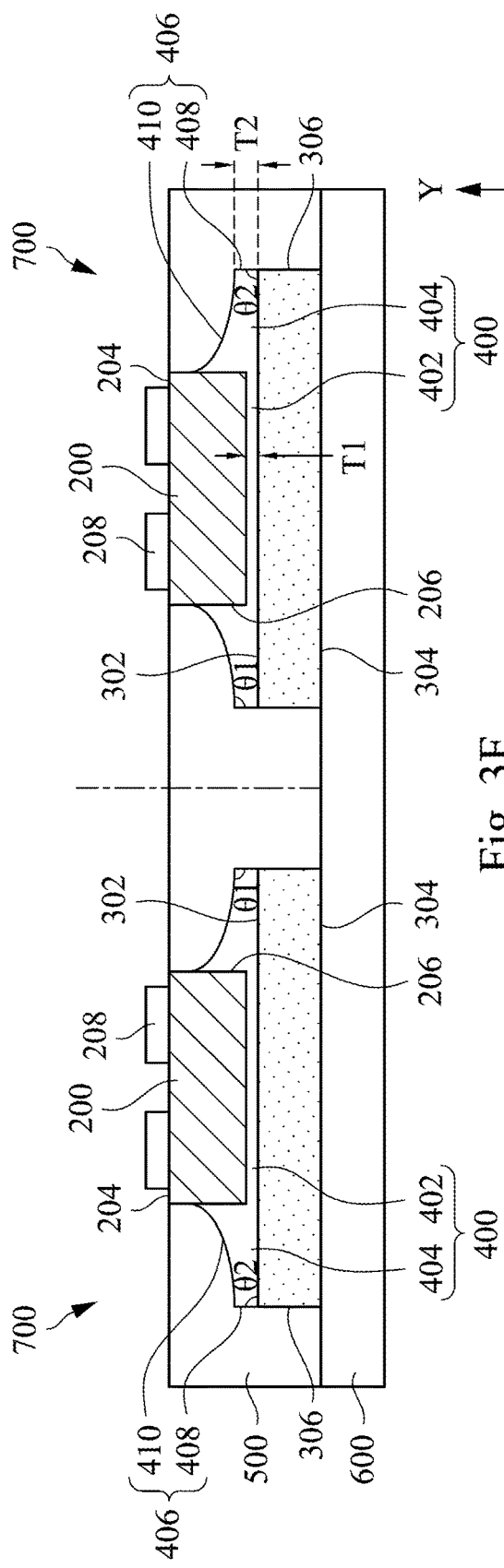
Figure 3G:
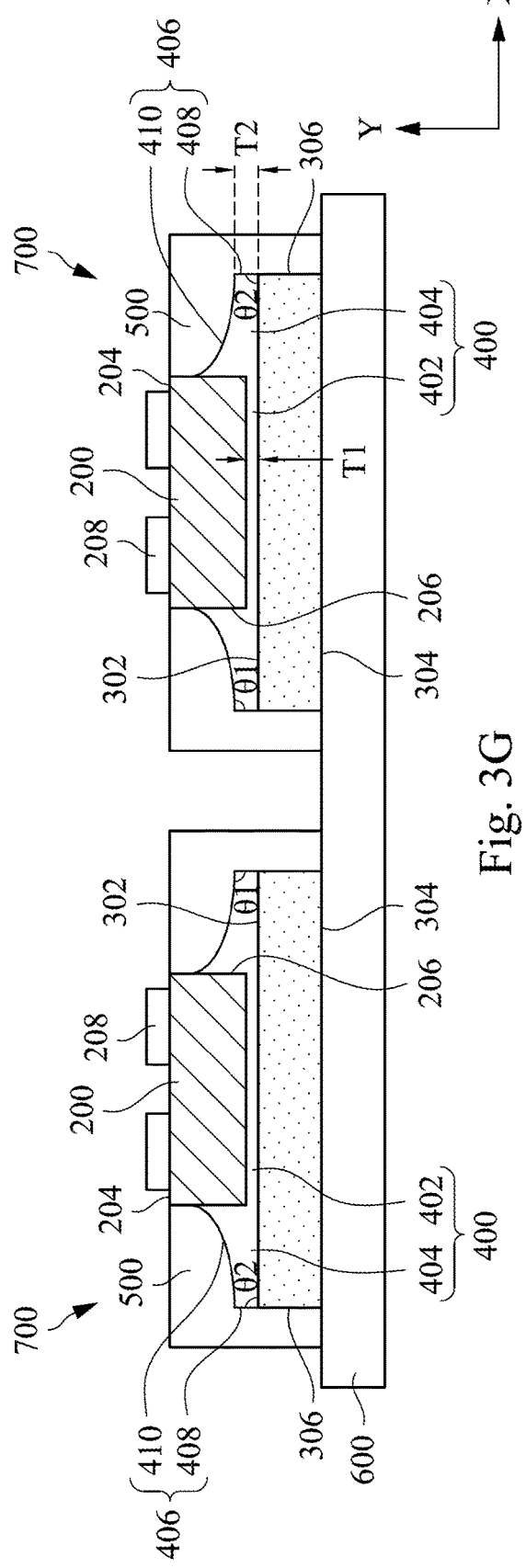
Figure 3H:
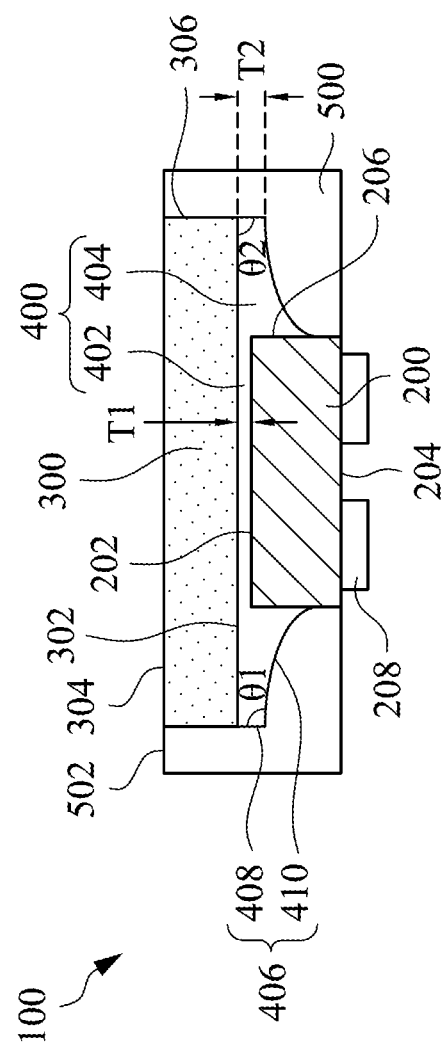

Reference is made to FIG. 3F. A reflective element 500 is formed on the substrate 600 to wrap the side surfaces of each of the light emitting units 700 and expose the two electrodes 208. A second cut is made through the reflective element 500 between the light emitting units 700 such that the reflective element 500 between the neighboring light emitting units 700 can be cut off to form the light emitting units 700 wrapped by the reflective element 500. Reference is made to FIG. 3G. The neighboring light emitting units 700 wrapped by the reflective element 500 are separated due to the second cut. Afterward, reference is made to FIG. 3H, the substrate 600 is removed such that the light emitting surface 304 of the wavelength conversion layer 300 is exposed, and then a light emitting diode device 100 is formed.

FIGS. 4A-4G are cross-sectional views of a light emitting diode device at various stages of a method in accordance with another embodiment. The main difference between the embodiment in FIGS. 3A-3H and the embodiment in FIGS. 4A-4G are FIGS. 4E-4G. The manufacturing steps of FIGS. 4A-4D may be similar to the steps in FIGS. 3A-3D and they are not repeated herein.

Figure 4A:
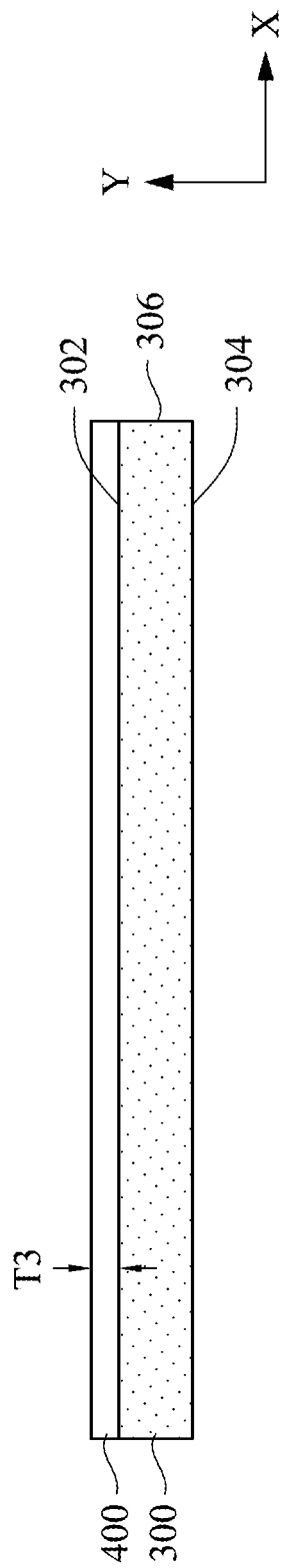
Figure 4B:
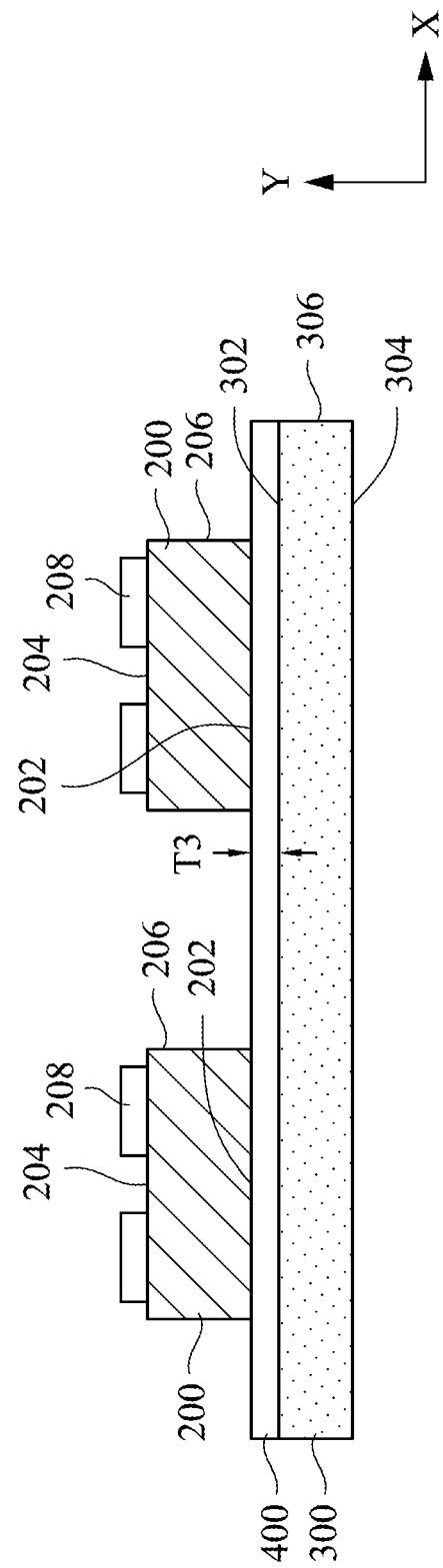
Figure 4C:
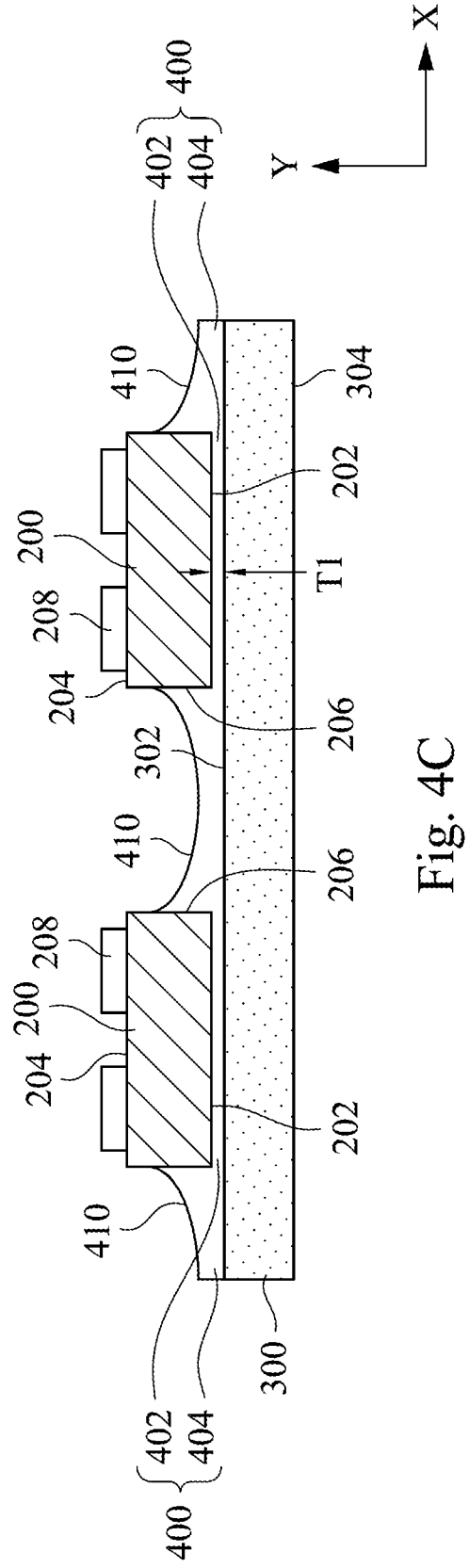
Figure 4D:
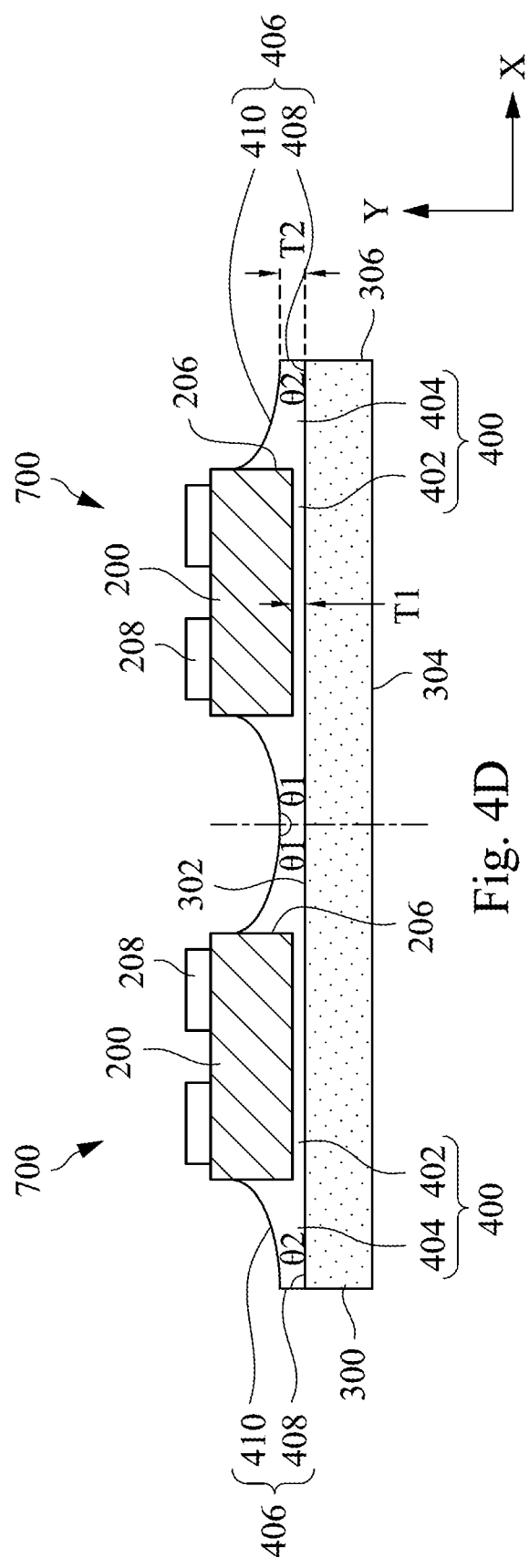

Reference is made to FIG. 4E. A substrate 800 is provided. The substrate 800 is a wiring substrate. In particular, in the present embodiment, the substrate is a wiring ceramic heat dissipation substrate or a MCPCB. The light emitting units 700 are flip chip electrically connected to the substrate 800. That is to say, as shown in FIG. 4D, a first cut is made to form a plurality of light emitting units 700 and then the light emitting units 700 are upside down such that the light emitting surface 304 of the wavelength conversion layer 300 is oriented facing upward and the light emitting diode chip 200 is in contact with and over the substrate 800. The two electrodes 208 face the substrate 800 and are electrically connected to the contact pad using solder (not shown).

Figure 4G:
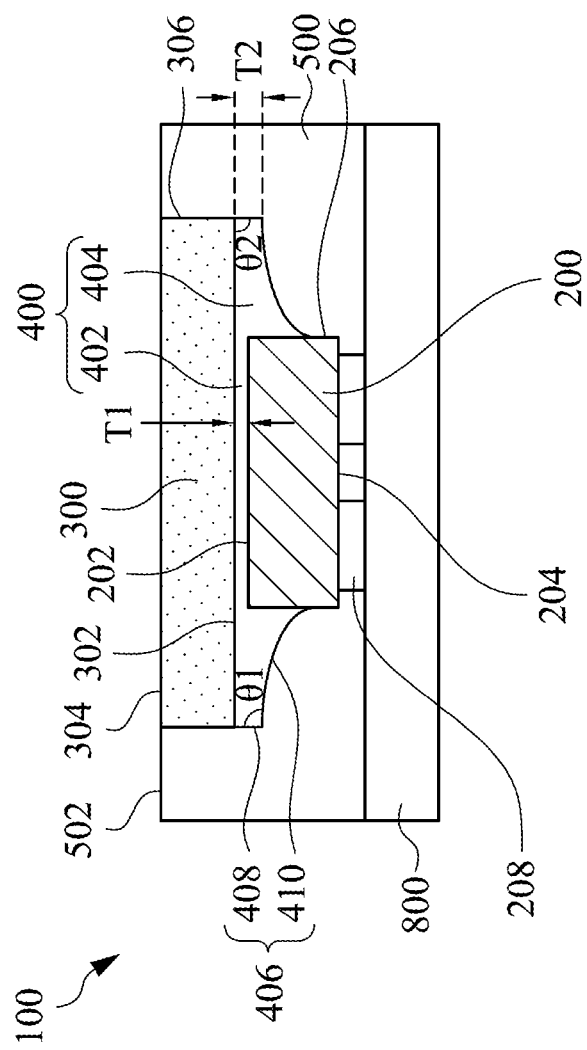

Reference is made to FIG. 4F. A reflective element 500 is formed on the substrate 800 to warp the side surfaces of each of the light emitting units 700. Afterward, a second cut is made through the reflective element 500 and the substrate 800 between the light emitting units 700 to form light emitting units 700 wrapped by the reflective element 500 on the substrate 800, as shown in FIG. 4G.

The light emitting diode device 100 of the embodiments of the present disclosure can be applied to suitable light emitting products, for example, backlight module of display apparatuses or other illuminating products.

The first portion 402 of the interlayer 400 of the light emitting diode device 100 between the wavelength conversion layer 300 and the light emitting diode chip 200 has a thickness T1 less than about 20 µm, which is thin enough to make the path of the heat dissipation of the light emitting diode device 100 become short. That is to say, the heat generated by the light emitting diode chip 200 can be transferred to the wavelength conversion layer 300 through the first portion 402 of the interlayer 400 and then be transferred to outer space, which results in alleviating the operation temperature of the light emitting diode chip 200. Therefore, the light emitting stability of the light emitting diode device 100 is increased. Since the linear surface 408 of the second portion 404 of the interlayer 400 is a substantial smooth surface, once the light reaches the interface between the linear surface 408 and the reflective element 500, the multi-reflective phenomenon of the light may be decreased, which results in the increased extraction efficiency of the side emitting light of the light emitting diode device 100. Moreover, the second portion 404 of the interlayer 400 with the increased volume can reduce a possibility of the blue light reflected directly back into the light emitting diode chip 200 itself from the reflective element 500, which reduces re-absorption of the blue light by the light emitting diode chip 200, which alleviates the loss of the efficiency of the blue light. The light emitting diode device 100 further includes a wavelength conversion layer 300 having the side surface 306 in direct contact with the reflective element 500 such that the light emitted by the light emitting diode chip 200 will not be transmitted to outer space from the top surface 502 of the reflective element 500 after passing through the first portion 402 or the second portion 404 of the interlayer 400. Therefore, the light uniformity of the light emitting diode device 100 is enhanced.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of manufacturing a light emitting diode device, comprising:
   providing a wavelength conversion layer;
   forming an interlayer on the wavelength conversion layer, wherein the interlayer is adhesive;
   disposing a plurality of light emitting diode chips on the interlayer at intervals;
   heating and pressing the interlayer such that a portion of the interlayer flows to the intervals between the light emitting diode chips and side surfaces of the light emitting diode chips, wherein a surface of the interlayer on the intervals between the light emitting diode chips forms a curved surface, the heating and the pressing make a tan δ of the interlayer be in a range from about 0.7 to about 3.0, and the tan δ equals to G"/G', in which G' is a storage elastic modulus of the interlayer, and G" is a loss elastic modulus of the interlayer;
   making a first cut through the interlayer on the intervals between the light emitting diode chips and the underlying wavelength conversion layer to form a plurality of light emitting units, wherein the first cut allows the interlayer to have at least one side surface, the side surface and the curved surface after making the first cut form a chamfer angle; and
   forming a reflective element to wrap a side surface of each of the light emitting units.

2. The method of claim 1, further comprising performing a solidification process, wherein the solidification process is performed after the heating and the pressing such that the interlayer is solidified on the side surface of the light emitting diode chips.

3. The method of claim 1, wherein the chamfer angle is in a range from about 90° to about 160°.

4. The method of claim 1, wherein after making the first cut, a substrate is provided such that the light emitting units are disposed on the substrate, and the reflective element is formed on the substrate to wrap side surfaces of each of the light emitting units.

5. The method of claim 4, further comprising making a second cut through the reflective element between the light emitting units to form the light emitting units wrapped by the reflective element.

6. The method of claim 5, wherein the substrate is removed after making the second cut.

7. The method of claim 4, wherein after providing the substrate, the light emitting units are upside down to allow the light emitting diode chips to be in contact with the substrate.

8. The method of claim 7, further comprising making a second cut through the reflective element and the substrate between the light emitting units to form the light emitting units wrapped by the reflective element on the substrate.

9. The method of claim 8, wherein the substrate is a wiring substrate, and the light emitting diode chip is flip chip mounted to the wiring substrate.

* * * * *